United States Patent
Lee et al.

(10) Patent No.: US 8,446,773 B2
(45) Date of Patent: May 21, 2013

(54) MEMORY SYSTEM AND PROGRAMMING METHOD THEREOF

(75) Inventors: Changhyun Lee, Suwon-si (KR); Jungdal Choi, Seoul (KR); Byeong-In Choe, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 33 days.

(21) Appl. No.: 13/272,879

(22) Filed: Oct. 13, 2011

(65) Prior Publication Data

US 2012/0081959 A1    Apr. 5, 2012

Related U.S. Application Data

(63) Continuation-in-part of application No. 12/656,083, filed on Jan. 15, 2010, now Pat. No. 8,059,466.

(30) Foreign Application Priority Data

Feb. 25, 2009 (KR) .................. 10-2009-0015932

(51) Int. Cl.
*G11C 16/04* (2006.01)
(52) U.S. Cl.
USPC ............ 365/185.18; 365/185.22; 365/185.09
(58) Field of Classification Search
USPC ..................... 365/185.18, 185.22, 189.09
See application file for complete search history.

(56) References Cited

U.S. PATENT DOCUMENTS

| | | | |
|---|---|---|---|
| 6,552,829 B1 | 4/2003 | Maciey et al. | |
| 7,466,598 B2 | 12/2008 | Park | |
| 8,081,516 B2 * | 12/2011 | Lee et al. | 365/185.18 |
| 8,169,831 B2 * | 5/2012 | Nguyen et al. | 365/185.21 |
| RE43,870 E * | 12/2012 | Lee et al. | 365/185.02 |
| 2005/0237816 A1 * | 10/2005 | Lue et al. | 365/185.28 |
| 2007/0189073 A1 | 8/2007 | Aritome | |
| 2008/0123407 A1 | 5/2008 | Park | |
| 2008/0192544 A1 | 8/2008 | Berman et al. | |
| 2010/0321999 A1 | 12/2010 | Yoo et al. | |
| 2011/0310671 A1 * | 12/2011 | Lee et al. | 365/185.19 |

FOREIGN PATENT DOCUMENTS

| | | |
|---|---|---|
| JP | 2005-025898 | 1/2005 |
| KR | 10-0769776 | 10/2007 |
| KR | 10-2008-0030253 | 4/2008 |

* cited by examiner

*Primary Examiner* — Tuan T. Nguyen
(74) *Attorney, Agent, or Firm* — Harness, Dickey & Pierce, P.L.C.

(57) ABSTRACT

Provided are a non-volatile memory system and a programming method thereof. The programming method of the non-volatile memory system includes adjusting a program-verify-voltage of a selected memory cell referring to program data to be written in an interfering cell configured to provide interference for the selected memory cell and programming the selected memory cell depending on the adjusted program-verify-voltage.

20 Claims, 14 Drawing Sheets

Fig. 5

| Interfering Cells | Level of verify voltage (considering WL+BL coupling) | | | Level of verify voltage (considering only WL coupling) | | |
|---|---|---|---|---|---|---|
| | P1 | P2 | P3 | P1 | P2 | P3 |
| No coupling | Vfy1_0 | Vfy2_0 | Vfy3_0 | Vfy1_0 | Vfy2_0 | Vfy3_0 |
| WL | Vfy1_1 | Vfy2_1 | Vfy3_1 | Vfy1_1 | Vfy2_1 | Vfy3_1 |
| 1-BL | Vfy1_2 | Vfy2_2 | Vfy3_2 | | - | |
| 2-BL | Vfy1_3 | Vfy2_3 | Vfy3_3 | | - | |
| 1-BL & WL | Vfy1_4 | Vfy2_4 | Vfy3_4 | | - | |
| 2-BL & WL | Vfy1_5 | Vfy2_5 | Vfy3_5 | | - | |

LSB page

MSB page

Interfering page

2nd page

3rd(MSB) page

Interfering page

Fig. 10A LSB page
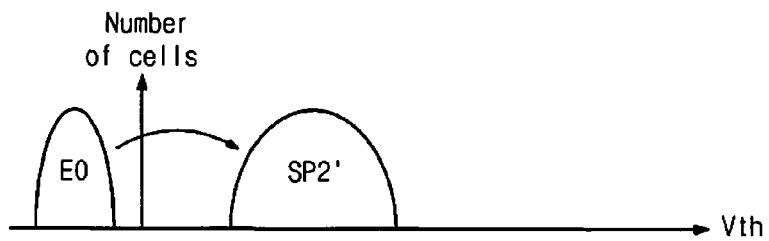
Fig. 10B MSB page
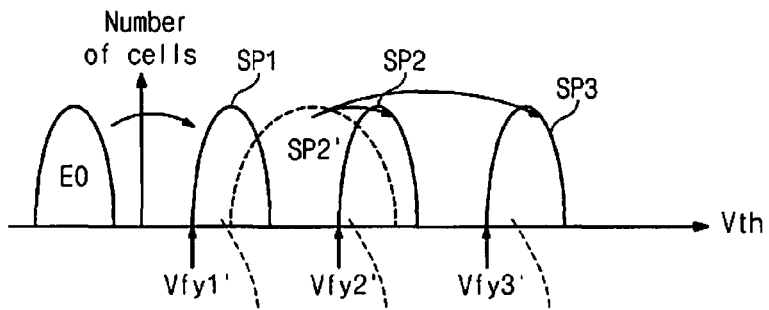
Fig. 10C Interfering page
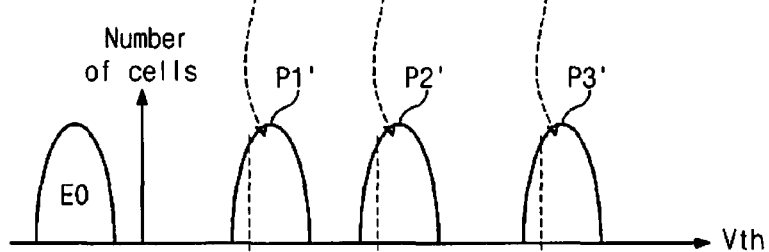
Fig. 10D Reprogram
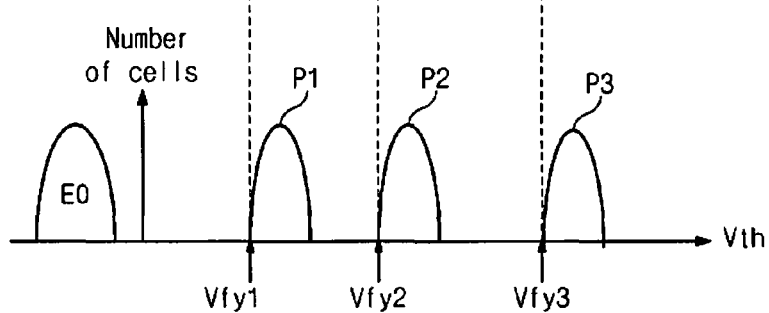

2nd page

3rd(MSB) page

Interfering page

Reprogram

MEMORY SYSTEM AND PROGRAMMING METHOD THEREOF

CROSS-REFERENCE TO RELATED APPLICATIONS

This application is a Continuation-In-Part (CIP) to commonly assigned and U.S. Non-Provisional patent application Ser. No. 12/656,083 filed Jan. 15, 2010 now U.S. Pat. No. 8,059,466 which claims priority under 35 U.S.C. §119 to Korean Patent Application 10-2009-0015932, filed on Feb. 25, 2009, in the Korean Intellectual Property Office (KIPO), the collective subject matter of which is hereby incorporated by reference.

BACKGROUND

1. Field

Example embodiments relate to a semiconductor memory device, and more particularly, to a non-volatile memory system and a programming method thereof.

2. Description of the Related Art

A semiconductor memory device may be categorized into a volatile semiconductor memory device and a non-volatile semiconductor memory device. The volatile semiconductor memory device has a faster read and write speed, but has a disadvantage that if an external power supply is disconnected, stored contents may be cleared. On the other hand, the non-volatile semiconductor memory device preserves the stored contents, even though an external power supply may be disconnected. Thus, the non-volatile semiconductor memory device may be utilized to store contents that should be preserved regardless of the supply of a power source.

Out of the non-volatile memory, for example, flash memory can electrically and collectively erase the data stored in cells, and may be widely used in, for example, a computer and a memory card. The flash memory may be categorized into a NOR type and NAND types depending on the connection state between the cells and the bit line. The NOR type flash memory may be a memory in which two or more cell transistors are connected in parallel to a one-bit line, and may store data using a Channel Hot Electron (CHE) scheme and erase the stored data using a F-N tunneling (Fowler-Nordheim tunneling) scheme. In addition, the NAND type flash memory may be a memory in which two or more cell transistors are connected in a series to a one-bit line, and may store data and erase the stored data using an F-N tunneling scheme.

Each memory cell in the flash memory device stores one-bit data or multi-bit data. When one-bit data is stored in one memory cell, the memory cell has two threshold voltage states, e.g., threshold voltages corresponding to any one of data "1" and data "0". On the other hand, when 2-bit data is stored in one memory cell, the memory cell has a threshold voltage corresponding to any one of four threshold voltage states. Further, when 3-bit data is stored in one memory cell, the memory cell may have a threshold voltage corresponding to any one of eight threshold voltage states. Developments have been made in various techniques that store 4-bit data or more in one memory cell.

SUMMARY

Example embodiments provide a non-volatile memory device and a writing method of the non-volatile memory device capable of providing greater reliability.

Example embodiments of the inventive concepts provide a programming method of a non-volatile memory device including adjusting a program-verify-voltage of a selected memory cell referring to programming data to be written in an interfering cell configured to provide interference for the selected memory cell, and programming the selected memory cell depending on the adjusted program-verify-voltage.

Example embodiments of the inventive concepts provide a memory system including a non-volatile memory device; and a memory controller controlling the non-volatile memory device to adjust a program-verify-voltage of a selected memory cell referring to program data to be written in an interfering cell, the interfering cell configured to provide interference for the selected memory cell of the non-volatile memory device and to program the selected memory cell depending on the adjusted program-verify-voltage.

BRIEF DESCRIPTION OF THE DRAWINGS

Example embodiments will be more clearly understood from the following detailed description taken in conjunction with the accompanying drawings. FIGS. 1-11 represent non-limiting, example embodiments as described herein.

FIG. 1 is a diagram schematically illustrating a non-volatile memory cell array according to example embodiments of the inventive concepts;

FIG. 2 is a block diagram illustrating a semiconductor memory device according to example embodiments of the inventive concepts;

FIG. 3 is a block diagram illustrating a non-volatile memory device according to example embodiments of the inventive concepts;

FIG. 4 is a flow chart illustrating a programming procedure according to example embodiments of the inventive concepts;

FIG. 5 is a table illustrating a verify voltage classifying method according to example embodiments of the inventive concepts;

FIG. 8 is a diagram illustrating a programming sequence of a multi-level cell;

FIG. 9 is a flow chart illustrating a programming procedure according to the other example embodiments of the inventive concepts;

FIGS. 10A to 10D and FIGS. 11A to 11D are distribution charts illustrating a programming procedure according to the other example embodiments of the inventive concepts with respect to levels of the threshold voltage;

Figure 1:
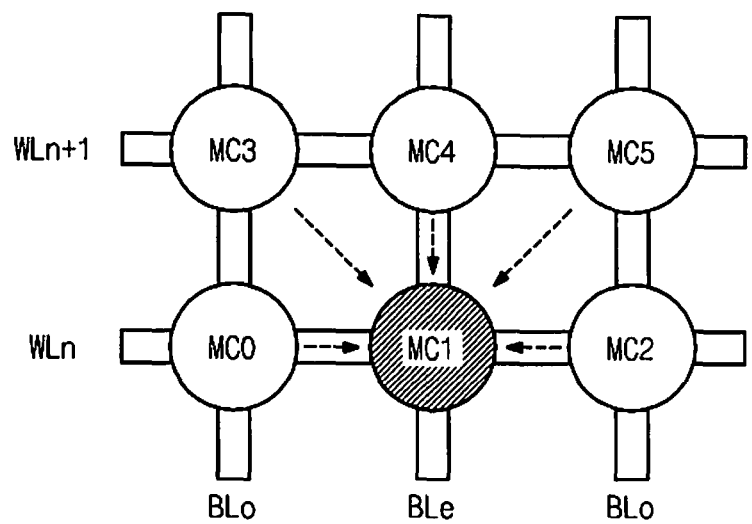

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Various example embodiments will be described more fully hereinafter with reference to the accompanying drawings, in which some example embodiments may be illustrated. Example embodiments may, however, be embodied in many different forms and should not be construed as limited to example embodiments set forth herein. Rather, these example embodiments may be provided so that this disclosure will be thorough and complete, and will fully convey the scope of example embodiments to those skilled in the art. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

In the following description, a NAND type flash memory device may be employed herein below as an example of the non-volatile memory device to describe the features and functions of example embodiments of the inventive concepts. Those skilled in the art will readily understand other advantages and performance of example embodiments of the inventive concepts with reference to the contents disclosed herein. In addition, the term "distribution" used herein means the number of memory cells corresponding to the threshold voltage in a certain unit (page, block, and chip) of memory cells. Further, memory cells per a page may be defined as the term "interfering cells" to describe the technical features of example embodiments of the inventive concepts. The interfering cells represent memory cells that give a large physical influence (for example, a coupling effect) to other memory cells of an adjacent or same page.

In fact, the terms "interfering cells" and "selected cells" influenced by the interfering cells may be relative concepts, and the interfering cells may be dependent on a physical influence from other memory cells. The classification criteria between the interfering cells and the selected memory cells may be changed and adjusted depending on operating conditions, programming manners and procedures, change of environment, and intention of the user in the memory device. In addition, example embodiments of the inventive concepts may be implemented or embodied by other example embodiments. Besides, the detailed description may be modified and changed by various aspects and applications, without departing from the scope, the technical spirit, and other objects of the inventive concepts. Example embodiments according to the inventive concepts will be described in detail with reference to the accompanying drawings.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a diagram schematically illustrating a non-volatile memory cell array 10. Referring to FIG. 1, any memory cell may be interfered with by adjacent or neighboring memory cells during its program operation. An example of interference between such neighboring cells may include a floating gate coupling effect that occurs between the neighboring cells.

The threshold voltage of the memory cell MC1 may be shifted from an original threshold voltage by a certain level due to the coupling effect. During program operation, the memory cell MC1 connected to an even-numbered bit line BLe may be exposed to a coupling effect with the memory cells MC0, MC2, MC3, and MC5 connected to odd-numbered bit lines BLo. The memory cells MC0 and MC2 may be connected to the same word line as the memory cell MC1, and the memory cells MC3 and MC5 have an effect in a diagonal direction causing a coupling between the bit lines. In addition, the memory cell MC4 may be connected to the same bit line BLe as the memory cell MC1. During the program operation of the memory cell MC4, the memory cell MC4 provides a coupling effect for the memory cell MC1 in a word line direction.

The coupling effect may be described as only one example that causes the shift of the threshold voltage in the memory cell MC1. In addition to the coupling effect, the threshold voltage of the memory cells may be shifted by other various factors. For example, the threshold voltage of the memory cells may be changed (for example, become lower) depending on the deterioration of an oxide layer due to a lapse of time, a Hot Temperature Stress(HTS), and an increase of a programming/erasing cycle (PIE cycle). In addition, the threshold voltage of the memory cell MC1 may become higher by a program disturbance occurring during any programming of peripheral cells.

The threshold voltage of memory cells may be shifted by the above-mentioned various factors. Thus, during the reading operation of the non-volatile memory device, because the read margin is reduced by the shift of the threshold voltage described above, the distributions of two neighboring threshold voltages may overlap each other. In example embodiments of the inventive concepts, the read-out data may include multi-bit errors. However, the interference between the memory cells may be minimized or reduced in the programming scheme according to example embodiments of the inventive concepts.

Figure 2:
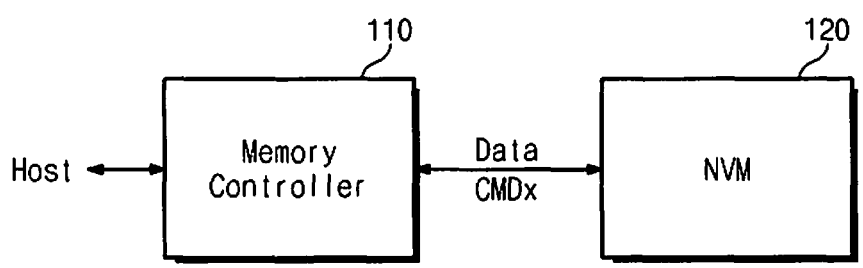

FIG. 2 is a block diagram schematically illustrating a semiconductor memory device 100 according to example embodiments of the inventive concepts. The semiconductor memory device 100 includes a non-volatile memory device 120 and a memory controller 110 interfacing the non-volatile memory device 120 with a host (alternatively, external device).

The memory controller 110 determines a program-verify-voltage of currently-programmed memory cells during the program operation based on data to be programmed to the above-mentioned adjacent memory cells. That is, the amount of interference in the currently-programmed memory cells may be quantified based on target states of adjacent memory cells. Depending on the quantified amount of interference, the memory controller 110 determines such that the program-verify-voltage in the currently-programmed memory cells may be higher than or equal to the level of the program-verify-voltage corresponding to the target state. The memory controller 110 provides a trimming command CMDx for the non-volatile memory device 120 to generate the determined program-verify-voltage.

Further, the non-volatile memory device 120 includes non-volatile memory elements that can maintain the stored data therein even though the power may be interrupted. The non-volatile memory device 120 provides a faster reading speed with relatively lower cost as compared to other memory elements. On the contrary, the memory cells of the non-volatile memory device 120 have a restricted overwriting operation. Thus, an erasing operation needs to be performed in advance to write data in the memory cells and the size of data to be written may be larger than that of data to be erased. Thus, there exists a need for a technique for reducing interference between memory cells in the non-volatile memory device 120 in response to a demand for high integration and large-capacity. The non-volatile memory device 120 may provide various levels of program-verify-voltage with respect to one target state due to the control (for example, CMDx command) of the memory controller 110.

Figure 3:
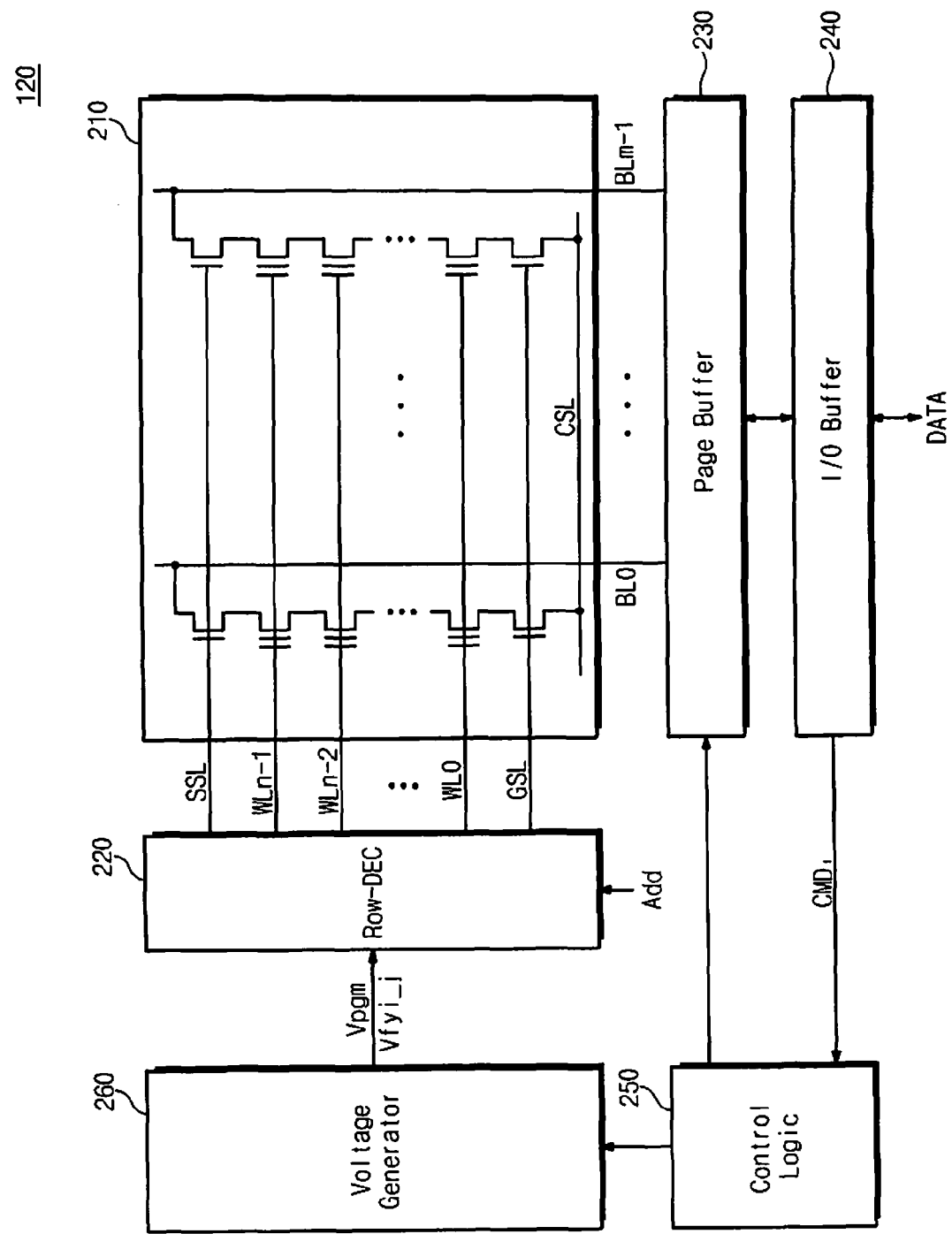

FIG. 3 is a block diagram schematically illustrating the non-volatile memory device 120 (see FIG. 2) according to example embodiments of the inventive concepts. Referring to FIG. 3, the non-volatile memory device 120 executes the program operation according to a procedure for reducing the interference between memory cells, when programming one page data. Such operation may be implemented by a voltage generator 260 providing various levels of program-verify-voltage Vfyi_j, a control logic 250, and a page buffer 230. A detailed description thereof may be as follows.

A cell array 210 includes memory cells connected to bit lines and word lines. In particular, a multi-level cell MLC may be programmed with any one of multiple threshold voltage distributions to store a plurality of bits to one cell. The multi-level cell should be densely programmed to include the number '$2^k$' of threshold voltage states corresponding to the number 'k' of bits stored in a limited threshold voltage window. Consequently, the read margin of the multi-level cell has to reduce as compared to a single level cell. In addition, when a memory cell connected to the same bit line is programmed, the coupling may be provided for another memory cell connected to the bit line, in a word line direction. Further, the coupling may be provided for a memory cell from the memory cells connected to different bit lines in a bit line direction.

A row decoder 220 generally selects a word line in response to a row address. The row decoder 220 transmits various word line voltages, which may be provided from the voltage generator 260, to selected word lines. During program operation, a program voltage Vpgm (about 15 to 20V) and a verify voltage (Vfyi_j) may be transmitted to a selected word line WL, and a pass voltage Vpass may be transmitted to an unselected word line WL. During the readout operation, the row decoder 220 provides a select read voltage Vrd provided from the voltage generator 260 for the selected word line and provides an unselect read voltage Vread (approximately 5V) to the unselected word line.

The page buffer 230 operates as a writer driver or a sense amplifier depending on its operating modes. For example, the page buffer 230 operates as a writer driver in a read operating mode and as a sense amplifier in the program operating mode. The page buffer 230 loads data in units of one page during the program operation. That is, the page buffer 230 receives data to be programmed, from the input/output buffer 240 to store in an internal latch. The page buffer 230 provides a ground voltage (for example, 0V) to the bit lines of the currently-programmed memory cells during the program operation of the loaded data. In addition, the page buffer 230 provides a precharge voltage (for example, Vcc) to the bit lines of program-inhibited memory cells.

The input and/or output buffer 240 stores temporarily an address or program data input through an input and/or output pin (I/O Pin). The input and/or output buffer 240 transmits the stored address to an address buffer (not illustrated), the program data to the page buffer 230, and a command to a command register (not illustrated). During the read operation, the read-out data provided from the page buffer 230 may be output to the exterior through the input and/or output buffer 240.

The control logic 250 controls the voltage generator 260 to generate a selected program-verify-voltage Vfyi_j depending on a command CMDi provided from the memory controller 110 (see FIG. 2) during the program operation. Additionally, the control logic 250 controls a trimming operation of the voltage generator 260 to generate the selected program-verify-voltage Vfyi_j.

The voltage generator 260 provides various DC voltages for programming the non-volatile memory device 120 in response to the control of the control logic 250. In particular, various levels of verify voltages may be provided depending on the control of the control logic 250. For example, 2-bit MLC classifies the magnitude of coupling influenced by the neighboring cells into six cases. In example embodiments of the inventive concepts, the voltage generator 260 may generate at least six levels of verify voltages to program the memory cell to the target state P2. That is, the voltage generator 260 may provide any one of a plurality of levels of verify voltages Vfy2_j (j=0, 1, 2, 3, 4, 5) for compensating influence on the coupling in the memory cell.

According to example embodiments of the inventive concepts illustrated in FIG. 3, the non-volatile memory device 120 can minimize or reduce coupling or interference between memory cells in which one page may be programmed.

Figure 4:
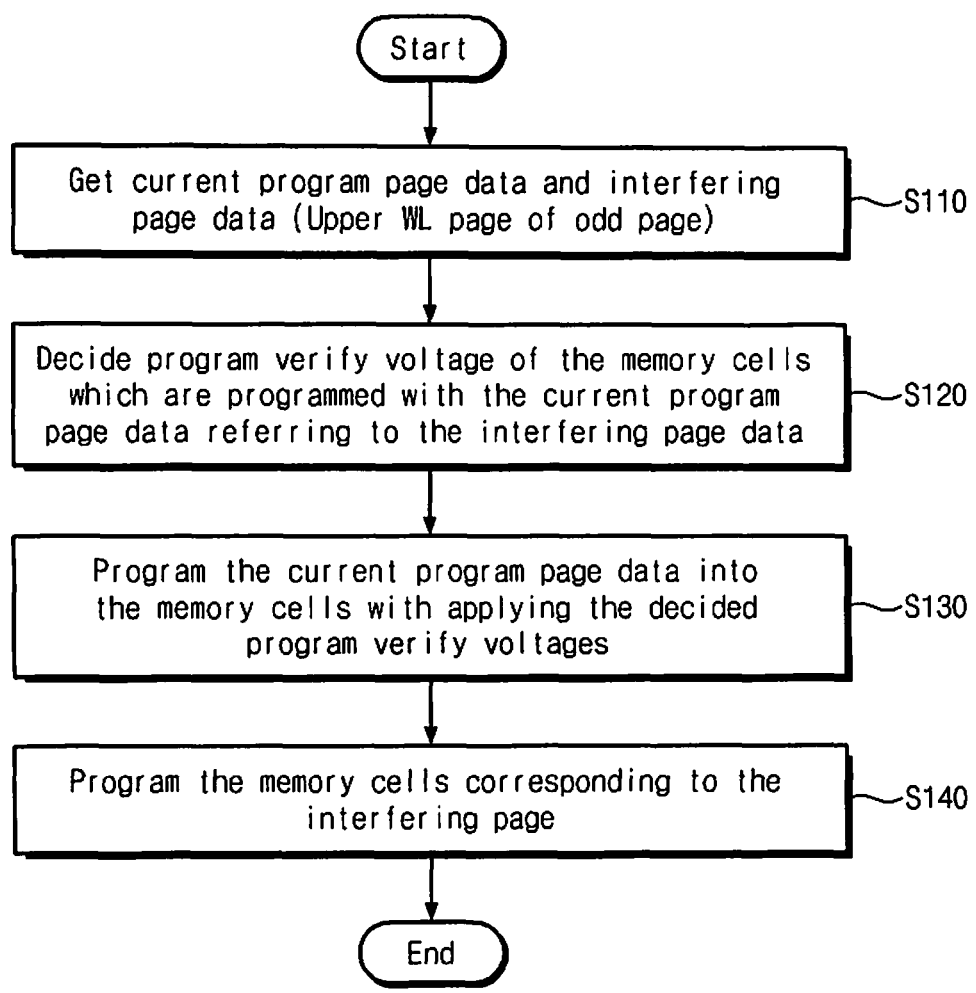

FIG. 4 is a flow chart schematically illustrating operation procedure performed by the memory controller 110 of FIG. 2. The control operation of the memory controller 110 for programming one page will be described with reference to FIG. 4.

In order to program one page data, the memory controller 110 needs to secure at least one or more interfering page data that will be programmed after the currently-programmed page. The memory controller 110 acquires the currently-programmed page data and the interfering page data stored in the cell causing interference to the memory cells in which the currently-programmed page data may be programmed. When the currently-programmed page is an even-numbered page, the data includes data stored in an odd-numbered page sharing the same word line with the currently-programmed page. In addition, the data may be even-numbered page data or odd-numbered page data in a word line WLn+1 adjacent to the word line WLn to which the currently-programmed memory cells may be connected (S110).

Based on the interfering page data, the memory controller 110 determines an amount of shift in the threshold voltage of the currently-programmed memory cells. In addition, the memory controller 110 determines verify voltages for each currently-programmed memory cells depending on the magnitude of shift in the determined threshold voltage (S120).

The memory controller 110 controls the non-volatile memory device 120 to program the currently-programmed data to the selected memory cells using the determined level of the verify voltage. That is, the memory controller 110 provides a command for the non-volatile memory device 120 to trim its voltage to the determined verify voltage based on the interfering page data before the program operation may be executed. After the verify voltage is trimmed, the memory controller 110 provides a program data and a program command for the non-volatile memory device 120 to program the currently-programmed page data to the selected memory cell (S130).

The currently-programmed page data may be programmed to the selected memory cell, but the threshold voltage of the memory cells may not reach the target state. That is, the threshold voltage of the selected memory cells may rise to a normal target threshold voltage after the interfering page data is programmed to the memory cells adjacent to the selected memory cell. Thus, the program operation for the selected memory cell may be completed after the program operation for the interfering cells is completed (S140).

According to the above-mentioned programming method, the physical influence, for example, coupling occurred by an interfering cell may be changed into favorable influence for completing the programming of the selected memory cell. As a result, errors due to the coupling between memory cells may be prevented or reduced during the programming of one page data.

FIG. 5 is a table listing example verify voltages for each state determined depending on interfering cells. Referring to FIG. 5, verify voltages for a MSB page in the non-volatile memory device employing the 2-bit multi-level cell (MLC) may be classified in every kind of the interfering cell. No coupling may be illustratively defined by a case where the interfering cell maintains an erased state E0 or may be programmed from a temporary state SP2 into a program state P2 in a shadow programming scheme. In addition, an occurrence of coupling may be defined to include a condition where the interfering cell may be programmed from an erased state E0 into a program state P1 and from a temporary state SP2 into a program state P3. Alternatively, the occurrence of coupling may be defined to include only a condition where the interfering cell may be programmed from an erased state E0 into a program state P1.

In example embodiments of the inventive concepts, types of the interfering cells may be as follows: the interfering cell "No coupling" is where no coupling occurs in the selected memory cell even if the interfering cell may be programmed; the interfering cell "WL" is where the coupling has influence on the selected memory cell from a word line; the interfering cell "1-BL" is where the coupling has influence on the selected memory cell from only one bit line; and the interfering cell "2-BL" is where the coupling has influence on the selected memory cell from two bit lines. In addition, the interfering cell may include, for example, the interfering cell "1-BL & WL" where the coupling has influence on the selected memory cell from a word line and a bit line and the interfering cell "2-BL & WL" where the coupling has influence on the selected memory cell from a word line and two bit lines.

When no coupling occurs in the selected memory cell even if the interfering cells are programmed, the verify voltages of Vfy1_0, Vfy2_0, and Vfy3_0 may be provided to program the selected memory cells for each target state. The verify voltage Vfy1_0 may be provided for the memory cells to be programmed into the program state P1, the verify voltage Vfy2_0 may be provided for the memory cells to be programmed into the program state P2, and the verify voltage Vfy3_0 may be provided for the memory cells to be programmed to the program state P3.

When the coupling has influence on the selected memory cell by only the interfering cells on the neighboring word line WLn+1 which are programmed later than the word line WLn connected to the selected memory cells, following verify voltages may be generated. The verify voltages of Vfy1_1, Vfy2_1, and Vfy3_1 will be supplied to the selected memory cells for each target state. The verify voltage Vfy1_1 may be provided for the memory cells to be programmed into the program state P1, the verify voltage Vfy2_1 may be provided for the memory cells to be programmed into the program state P2, and the verify voltage Vfy3_1 may be provided for the memory cells to be programmed into the program state P3.

There may be two cells where the coupling has influence on the selected memory cells from only bit lines adjacent to the selected memory cells. When the memory cell on any one of adjacent bit lines is the interfering cell, a verify voltage Vfy1_2 may be provided for the memory cells to be programmed into the program state P1, a verify voltage Vfy2_2 may be provided for the memory cells to be programmed into the program state P2, and a verify voltage Vfy3_2 may be provided for the memory cells to be programmed into the program state P3. Similarly, when the memory cells corresponding to all two adjacent bit lines are the interfering cell, a verify voltage Vfy1_3 may be provided for the memory cells to be programmed into the program state P1, a verify voltage Vfy2_3 may be provided for the memory cells to be programmed into the program state P2, and a verify voltage Vfy3_3 may be provided for the memory cells to be programmed into the program state P3.

When all of the memory cells connected to a word line and a bit line adjacent to each other are interfering cells, two verify voltages may be generated. That is, when the memory cells on the word line or any one of bit lines adjacent to the selected memory cell are an interfering cell, a verify voltage Vfy1_4 may be provided for the memory cells to be programmed into the program state P1, a verify voltage Vfy2_4 may be provided for the memory cells to be programmed into the program state P2, and a verify voltage Vfy3_4 may be provided for the memory cells to be programmed into the program state P3.

On the other hand, when the memory cells on an adjacent word line and two adjacent bit lines are the interfering cell, the highest coupling may be generated. Thus, a verify voltage Vfy1_5 may be provided for the memory cells to be programmed into the program state P1, a verify voltage Vfy2_5 may be provided for the memory cells to be programmed into the program state P2, and a verify voltage Vfy3_5 may be provided for the memory cells to be programmed into the program state P3. That is. the selected memory cells may be programmed when the lowest verify voltages may be provided.

Example embodiments of the inventive concepts have been described with reference to a cell array structure shielding the influence between bit lines by selecting even and odd-numbered bit lines. However, example embodiments of the inventive concepts may be applicable to the memory cell of an improved bit line structure. That is, as an example of the case where the coupling occurs in only the word line direction, the table indicates two groups of verify voltages when no coupling occurs and the memory cell connected to a neighboring word line may be the interfering cell. When no coupling occurs, the above-described verify voltages Vfy1_0, Vfy2_0, and Vfy3_0 may be provided. When the coupling has influence on the selected memory cells from a word line, the verify voltages Vfy1_1, Vfy2_1, and Vfy3_1 may be provided according to each of the program states.

As described above, the magnitude of coupling may be classified based on the six kinds of interfering cells, but example embodiments of the inventive concepts may not be limited thereto. Specifically, because the magnitude of coupling may be influenced by the program state of the adjacent interfering cell, the magnitude of coupling may be classified by additionally dividing the program state of the interfering cell. In example embodiments of the inventive concepts, the level of the verify voltage may be further subdivided.

Figure 6A:
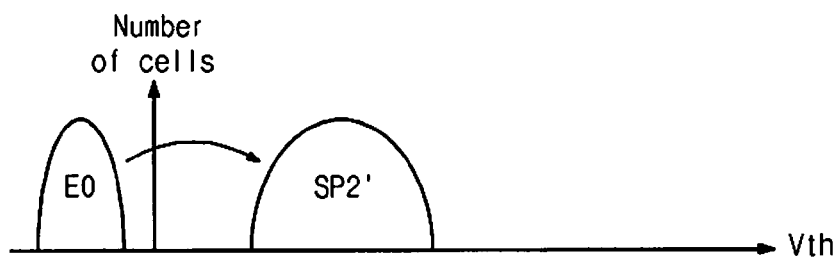
FIGS. 6A to 6C and FIGS. 7A to 7C are distribution charts illustrating a programming procedure according to example embodiments of the inventive concepts with respect to levels of the threshold voltage.
Figure 6B:
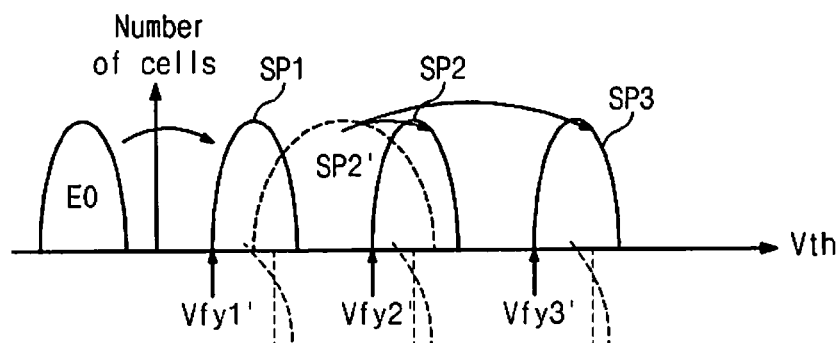
Figure 6C:
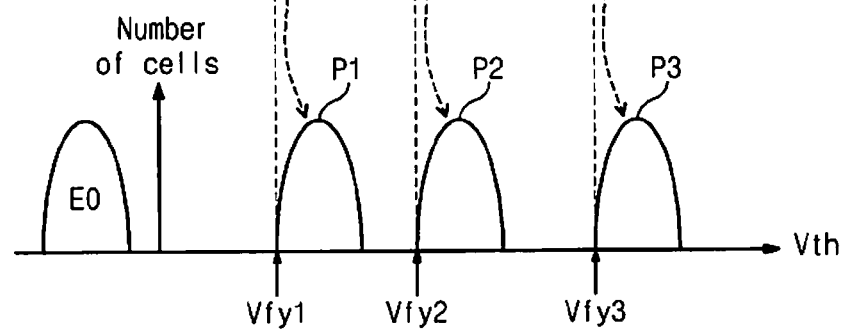

FIGS. 6A to 6C are distribution charts schematically illustrating the programming procedures using the verify voltages defined in the table of FIG. 5. FIG. 6 illustrates the process in which the selected memory cells may be programmed to a target state by the coupling of the interfering cells.

The distribution chart of FIG. 6A illustrates the states of the threshold voltage after a LSB page is programmed to the selected memory cells. Due to the programming of the LSB page, the memory cells have the state of threshold voltage corresponding to the erased state E0 or the temporary program state SP2'.

The distribution chart of FIG. 6B schematically illustrates a program operation an MSB page using verify voltages (Vfyi', where i=1, 2, 3) determined by the scheme of example embodiments of the inventive concepts and program states SP1, SP2, and SP3 formed by the program operation. The memory cells corresponding to the final target state P3 may be programmed from a temporary state SP2' to the program state SP3 by the verify voltage Vfy3'. The memory cells corresponding to the final target state P2 may be programmed from the temporary state SP2' to the program state SP2 by the verify voltage Vfy2'. The memory cells corresponding to the final target state P1 may be programmed from the erased state E0 to the program state SP1 by the verify voltage Vfy1'.

In example embodiments of the inventive concepts, the verify voltage Vfy1' may be any one of the verify voltages Vfy2_j, where j may be an integer of $0 \leq j \leq 5$) listed in the table of FIG. 5. In addition, the verify voltage Vfy2' may be any one of the verify voltages (Vfy2_j, where j may be an integer of $0 \leq j \leq 5$). The verify voltage Vfy3' may be any one of the verify voltages (Vfy3_j, where j may be an integer of $0 \leq j \leq 5$).

The distribution chart of FIG. 6C schematically illustrates an effect where the threshold voltages of previously programmed memory cells may be increased by the programming of the interfering cells. Using the verify voltages Vfy1', Vfy2', and Vfy3', the previously selected memory cells may be programmed to each of the target states P1, P2, and P3 by the influence of the coupling. As a result, complementing an incomplete program operation of the memory cells may be possible due to the coupling and various physical influences by interfering cells. Thus, the physical influence by the interfering cell can be used.

Figure 7A:
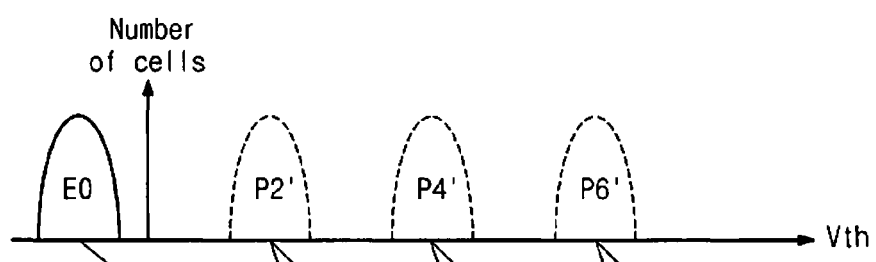
Figure 7B:
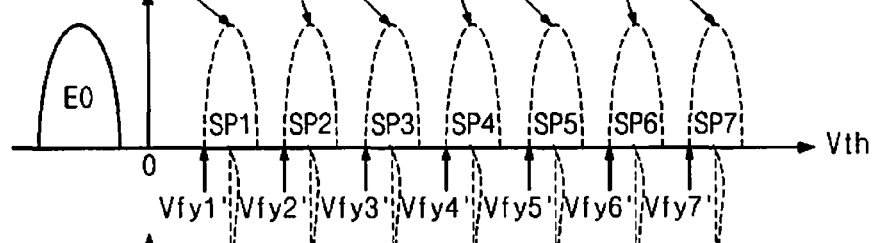
Figure 7C:
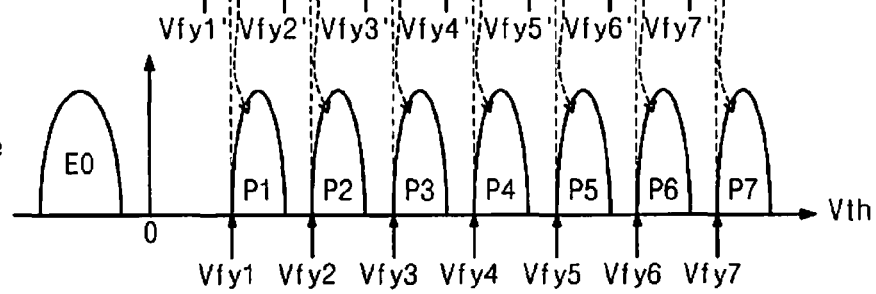

FIGS. 7A to 7C are distribution charts schematically illustrating an advantage of example embodiments of the inventive concepts with respect to 3-bit multilevel cell. FIG. 7 illustrates advantages of example embodiments of the inventive concepts during only the program operation of the MSB page.

The distribution chart of FIG. 7A illustrates a state where a second page was programmed. That is, the threshold voltage of the selected memory cells may be located at any one of a plurality of temporary states E0, P2', P4', and P6' by the program of the second page.

The distribution charts of FIGS. 7B and 7C illustrate sequentially the program operation of a third page. In particular, the distribution chart of FIG. 7B illustrates the program procedure for the selected memory cells in consideration of the magnitude of the coupling by the interfering cells. In programming the selected memory cells, the memory cells most influenced by the interfering cells may be programmed depending on the verify voltages Vfy1', Vfy2', Vfy3', Vfy4', Vfy5', Vfy6', and Vfy7' less than the verify voltages corresponding to the target states in consideration of physical influences to be caused by the interfering cells.

By the verify voltages for compensating the coupling, the memory cells corresponding to the final target state P1 may be programmed from the erased state E0 to the program state SP1 by the verify voltage Vfy1'. The memory cells corresponding to the final target state P2 may be programmed from temporary state P2' to the program state SP2 by the verify voltage Vfy2'. The memory cells corresponding to the final target state P3 may be programmed from a temporary state P2' to the program state SP3 by the verify voltage Vfy3'. The memory cells to be programmed to each of the final target states P4, P5, P6, and P7 may be programmed to the program states SP4, SPS, SP6, and SP7 by the verify voltages Vfy4', Vfy5', Vfy6', and Vfy7'.

In the programming procedure for the memory cells described in the distribution chart of FIG. 7B, all the other cells may be simultaneously programmed, or alternatively may be sequentially executed for each of the program state P2', P4', and P6'. For example, the memory cells of a high-level state may be programmed. Further, the other cells may be programmed as a group by grouping the target states. The memory cells corresponding to the program states P4' and P6' may be programmed, and subsequently the memory cells corresponding to the program state P2' may be programmed. In example embodiments of the inventive concepts, the verify voltages Vfy1', Vfy2', Vfy3', Vfy4', Vfy5', Vfy6', and Vfy7' may be values considering the magnitude of physical influences influenced by the program of the interfering cells.

The distribution chart of FIG. 7C illustrates that the threshold voltage of the memory cells, which are previously programmed by the program of the interfering cells, may be increased. By the verify voltages Vfy1', Vfy2', Vfy3', Vfy4', Vfy5', Vfy6', and Vfy7', the coupling has influence on the selected memory cells, and the selected memory cells may be programmed to each of the target states P1, P2, P3, P4, P5, P6, and P7.

In example embodiments of the inventive concepts, the influence of coupling by the interfering cells may be the largest when the memory cells are programmed from the erased state E0 to the programmed state P1. The influence of coupling by the interfering cells may be the second largest when the memory cells are programmed to the program states P3, P5, and P7. The influence of coupling by the interfering cells may be the third largest when the memory cells are programmed to the program states P2, P4, and P6. If the verify voltages may be determined by grouping the magnitude of the coupling, setting the magnitude of the more simplified verify voltage may be possible. For example, simply setting the verify voltage may be possible by classifying the influence of coupling when the memory cells are programmed from the erased state E0 to the program state P1.

As a result, the coupling and various physical influences by interfering cells can complement the incomplete program operation of the memory cells. Thus, the coupling by the interfering cell can favorably be used, thereby improving the distribution of the threshold voltage.

Figure 8:
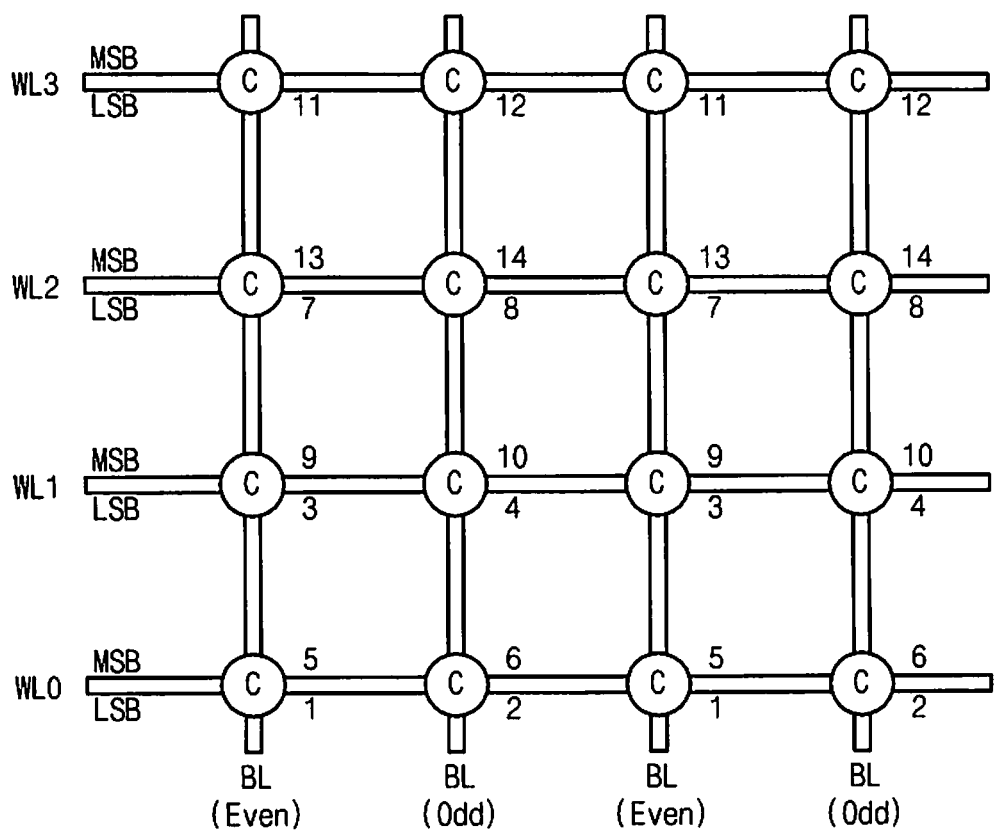

FIG. 8 is a diagram schematically illustrating the program sequences in the cell array 200 with respect to 2-bit multilevel cells. As described above, when even-numbered pages are first programmed and odd-numbered pages are programmed, the memory cells corresponding to even-numbered pages may be relatively further interfered with compared to the memory cells corresponding to odd-numbered pages. Thus, during only the program operation of even-numbered pages, six program-verify-voltages (Vfyi_j, for j=0, 1, 2, 3, 4, 5) for each target state Pi may be applied. In addition, because interference in the bit line direction may be little during the program of odd-numbered pages, two program-verify-voltages (Vfyi_j, for j=0, 1) for each target state Pi may be applied in consideration of only the interference in the word line.

In addition, when the memory cells are programmed depending on the program sequences illustrated in the drawing, it may be necessary to consider a case where a plurality of page data may be successively programmed in one block. That is, when the plurality of pages are successively programmed, the interfering cells corresponding to the selected memory cells to be finally programmed may be treated as a dummy. That is, a dummy page may be the high-level word line adjacent to the finally programmed word line (a case where the program procedure proceeds from a low-level word line to a high-level word line.) in the successive program operation. When the program sequence proceeds from a high-level word line to a low-level word line, the low-level word line adjacent to the finally programmed word line may be designated as a dummy page.

Figure 9:
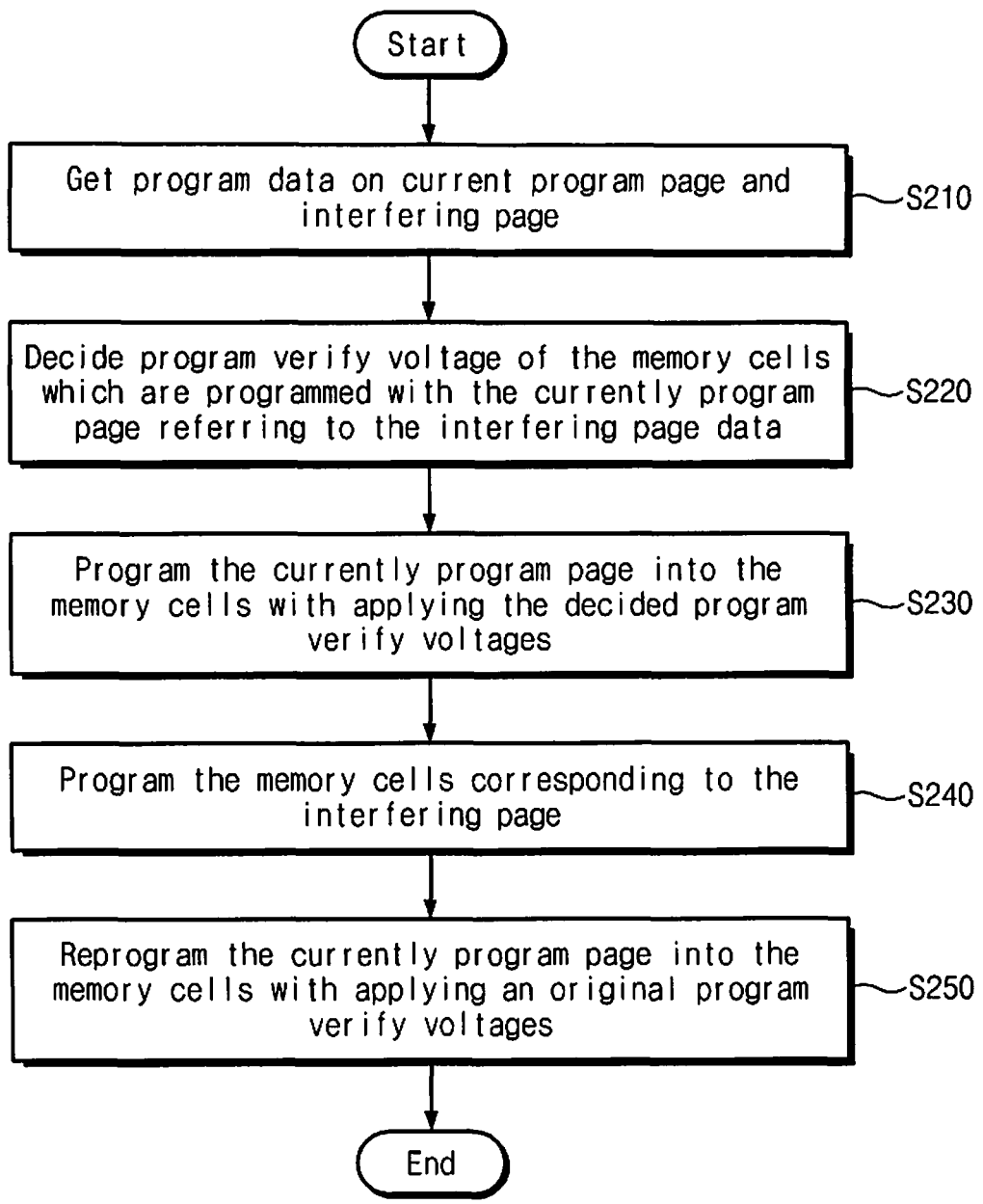

FIG. 9 is a flow chart schematically illustrating another embodiment of operation procedure performed by the memory controller 110 of FIG. 2. The control operation of the memory controller 110 for programming one page will be described with reference to FIG. 9.

In order to program one page data, the memory controller 110 needs to secure at least one or more interfering page data that will be programmed after the currently-programmed page. The memory controller 110 acquires the currently-programmed page data and the interfering page data stored in the cell causing interference to the memory cells in which the currently-programmed page data may be programmed. When the currently-programmed page is an even-numbered page, the data includes data stored in an odd-numbered page sharing the same word line with the currently-programmed page. In addition, the data may be even-numbered page data or odd-numbered page data in a word line WLn+1 adjacent to the word line WLn to which the currently-programmed memory cells may be connected. However, present invention is not limited within the embodiment. The non-volatile memory device 120 may include an all bit line (ABL) structured cell array. In this case, all of the memory cells connected to the word line WLn are programmed same time. Thus the currently-programmed page correspond to the word line WLn, the page data correspond to the word line WLn+1 causes interference to the memory cells connected to the word line WLn (S210).

Based on the interfering page data, the memory controller 110 determines an amount of shift in the threshold voltage of the currently-programmed memory cells. In addition, the memory controller 110 determines verify voltages for each currently-programmed memory cells depending on the magnitude of shift in the determined threshold voltage (S220).

The memory controller 110 controls the non-volatile memory device 120 to program the currently-programmed data to the selected memory cells using the determined level of the verify voltage. That is, the memory controller 110 provides a command for the non-volatile memory device 120 to trim its voltage to the determined verify voltage based on the interfering page data before the program operation may be executed. After the verify voltage is trimmed, the memory controller 110 provides a program data and a program command for the non-volatile memory device 120 to program the currently-programmed page data to the selected memory cell (S230).

The currently-programmed page data may be programmed to the selected memory cell, but the threshold voltage of the memory cells may not reach the target state. That is, the threshold voltage of the selected memory cells may rise to a normal target threshold voltage after the interfering page data is programmed to the memory cells adjacent to the selected memory cell (S240).

After the interfering page data is programmed to the memory cells adjacent to the selected memory cell, the threshold voltage distribution of the selected memory cells may increase. However, further programming operation is needed to increase the read margin. Thus, further programming operation under the condition of original program verify voltage can be executed. Thus, the program operation for the selected memory cell may be completed after the program operation for the selected memory cells via original program verify voltage is completed (S250).

According to the above-mentioned programming method, the physical influence, for example, coupling occurred by an interfering cell may be changed into favorable influence for completing the programming of the selected memory cell. As a result, errors due to the coupling between memory cells may be prevented or reduced during the programming of one page data.

FIGS. 10A to 10D are distribution charts schematically illustrating the programming procedures using the verify voltages defined in the table of FIG. 5. FIG. 10A to 10D illustrate the process in which the selected memory cells may be programmed to a target state by the coupling of the interfering cells and reprogramming process.

The distribution chart of FIG. 10A illustrates the states of the threshold voltage after a LSB page is programmed to the selected memory cells.

Due to the programming of the LSB page, the memory cells have the state of threshold voltage corresponding to the erased state EO or the temporary program state SP2'.

The distribution chart of FIG. 10B schematically illustrates a program operation an MSB page using verify voltages (Vfyi', where i=1, 2, 3) determined by the scheme of example embodiments of the inventive concepts and program states SP1, SP2, and SP3 formed by the program operation. The memory cells corresponding to the final target state P3 may be programmed from a temporary state SP2' to the program state SP3 by the verify voltage Vfy3'. The memory cells corresponding to the final target state P2 may be programmed from the temporary state SP2' to the program state SP2 by the verify voltage Vfy2'. The memory cells corresponding to the final target state P1 may be programmed from the erased state E0 to the program state SP1 by the verify voltage Vfy1'.

In example embodiments of the inventive concepts, the verify voltage Vfy1' may be any one of the verify voltages Vfy1_j, where j may be an integer of $0 \leq j \leq 5$) listed in the table of FIG. 5. In addition, the verify voltage Vfy2' may be any one of the verify voltages (Vfy2_j, where j may be an integer of $0 \leq j \leq 5$). The verify voltage Vfy3' may be any one of the verify voltages (Vfy3_j, where j may be an integer of $0 \leq j \leq 5$).

The distribution chart of FIG. 10C schematically illustrates an effect where the threshold voltages of previously programmed memory cells may be increased by the programming of the interfering cells. Using the verify voltages Vfy1', Vfy2', and Vfy3', the previously selected memory cells may be programmed to each of the states P1', P2', and P3' by the influence of the coupling. However, programming effect by the influence of the coupling may not provide much reliability. Thus, the selected memory cells having the states P1', P2', and P3' should be reprogrammed to ensure high reliability.

The distribution chart of FIG. 10D schematically illustrates a reprogram operation using original verify voltages (Vfyi, where i=1, 2, 3) determined by the scheme of example embodiments of the inventive concepts and program states P1, P2, and P3 are formed by the reprogram operation.

FIGS. 11A to 11D are distribution charts schematically illustrating an advantage of example embodiments of the inventive concepts with respect to 3-bit multilevel cell. FIG. 11A to 11D illustrates advantages of example embodiments of the inventive concepts during only the program operation of the MSB page.

Figure 11A:
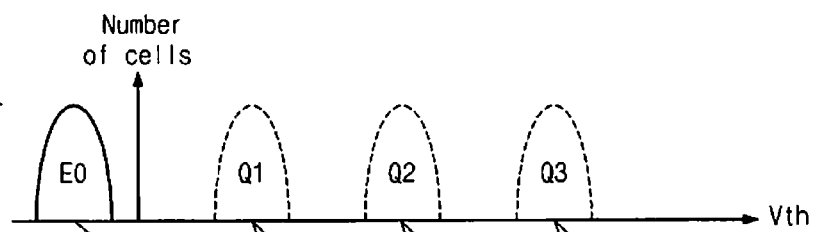

The distribution chart of FIG. 11A illustrates a state where a second page was programmed. That is, the threshold voltage of the selected memory cells may be located at any one of a plurality of temporary states E0, Q1, Q2, and Q3 by the program of the second page.

Figure 11B:
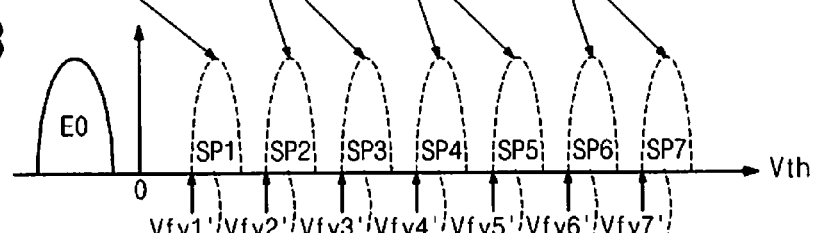
Figure 11C:
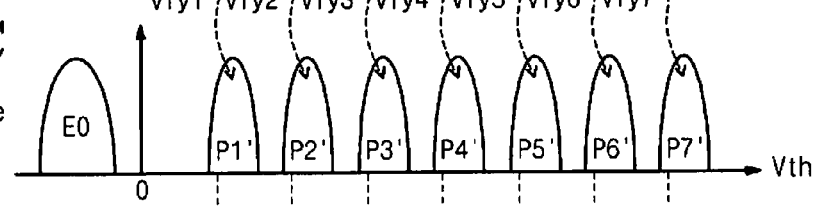
Figure 11D:
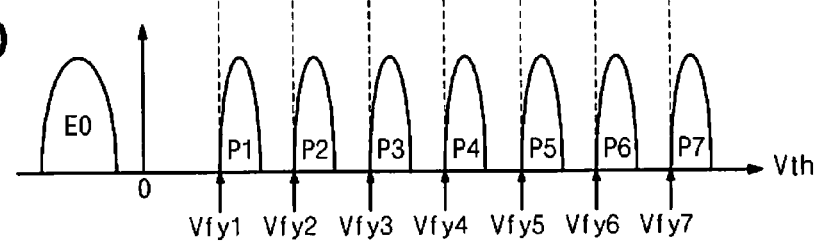

The distribution charts of FIGS. 11B and 11D illustrate sequentially the program operation of a third page. In particular, the distribution chart of FIG. 11B illustrates the program procedure for the selected memory cells in consideration of the magnitude of the coupling by the interfering cells. In programming the selected memory cells, the memory cells most influenced by the interfering cells may be programmed depending on the verify voltages Vfy1', Vfy2', Vfy3', Vfy4', Vfy5', Vfy6', and Vfy7' less than the verify voltages corresponding to the target states in consideration of physical influences to be caused by the interfering cells.

By the verify voltages for compensating the coupling, the memory cells corresponding to the final target state P1 may be programmed from the erased state EO to the program state SP1 by the verify voltage Vfy1'. The memory cells corresponding to the final target state P2 may be programmed from temporary state P2' to the program state SP2 by the verify voltage Vfy2'. The memory cells corresponding to the final target state P3 may be programmed from a temporary state P2' to the program state SP3 by the verify voltage Vfy3'. The memory cells to be programmed to each of the final target states P4, P5, P6, and P7 may be programmed to the program states SP4, SPS, SP6, and SP7 by the verify voltages Vfy4', Vfy5', Vfy6', and Vfy7'.

In the programming procedure for the memory cells described in the distribution chart of FIG. 11B, all the other cells may be simultaneously programmed, or alternatively may be sequentially executed for each of the program state Q1, Q2, and Q3. For example, the memory cells of a high-level state may be programmed. Further, the other cells may be programmed as a group by grouping the target states. The memory cells corresponding to the program states Q2 and Q3 may be programmed, and subsequently the memory cells corresponding to the program state Q1 may be programmed. In example embodiments of the inventive concepts, the verify voltages Vfy1', Vfy2', Vfy3', Vfy4', Vfy5', Vfy6', and Vfy7' may be values considering the magnitude of physical influences influenced by the program of the interfering cells.

The distribution chart of FIG. 11C illustrates that the threshold voltage of the memory cells, which are previously programmed by the program of the interfering cells, may be increased. By the verify voltages Vfy1', Vfy2', Vfy3', Vfy4', Vfy5', Vfy6', and Vfy7', the coupling has influence on the selected memory cells, and the selected memory cells may be programmed to each of the states P1', P2', P3', P4', P5', P6', and P7'.

In example embodiments of the inventive concepts, the influence of coupling by the interfering cells may be the largest when the memory cells are programmed from the erased state EO to the programmed state P1. The influence of coupling by the interfering cells may be the second largest when the memory cells are programmed to the program states P3, P5, and P7. The influence of coupling by the interfering cells may be the third largest when the memory cells are programmed to the program states P2, P4, and P6. If the verify voltages may be determined by grouping the magnitude of the coupling, setting the magnitude of the more simplified verify voltage may be possible. For example, simply setting the verify voltage may be possible by classifying the influence of coupling when the memory cells are programmed from the erased state E0 to the program state P1.

The distribution chart of FIG. 11D schematically illustrates a reprogram operation using original program verify voltages (Vfyi, where i=1, 2, 3, 4, 5, 6, 7) determined by the scheme of example embodiments of the inventive concepts and target states P1, P2, P3, P4, P5, P6, and P7 are formed by the reprogram operation.

Figure 12:
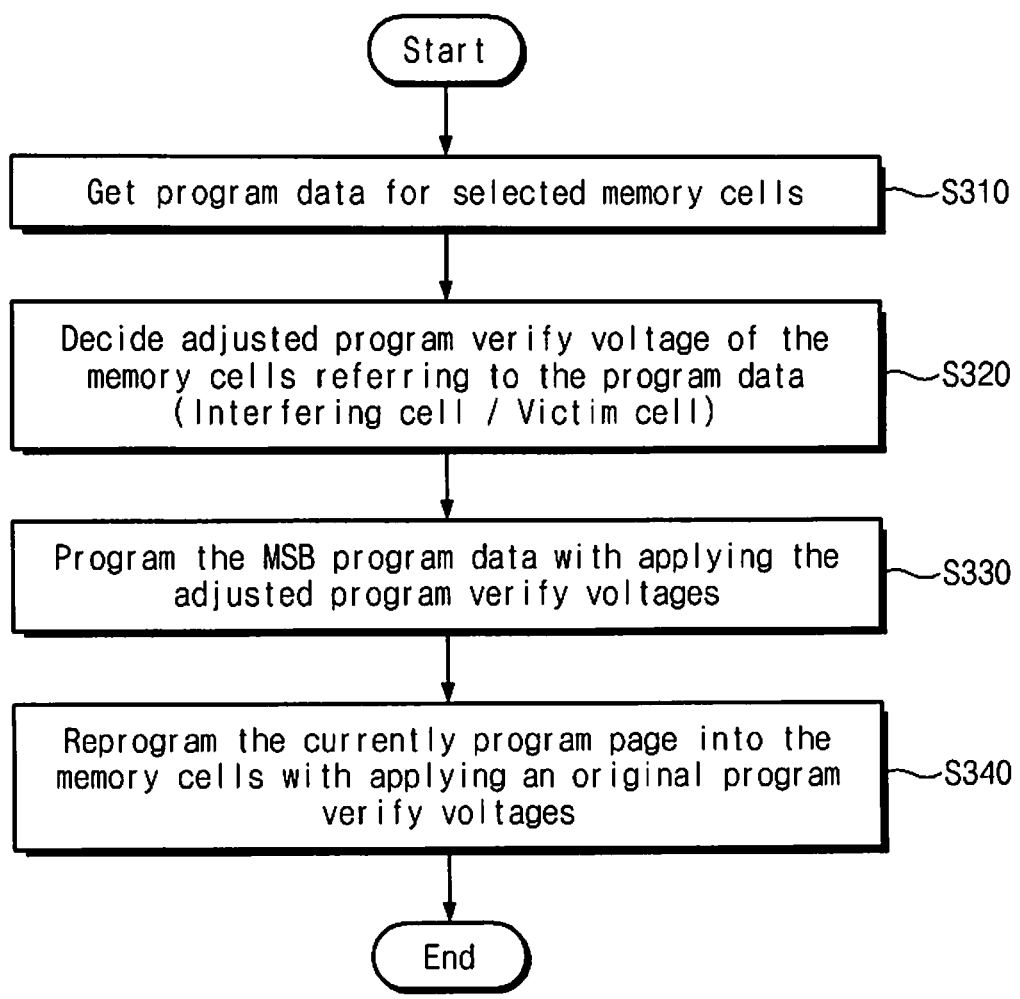
FIG. 12 is a flow chart illustrating a programming procedure according to another example embodiments of the inventive concepts.

As a result, the coupling and various physical influences by interfering cells can complement the incomplete program operation of the memory cells. Thus, the coupling by the interfering cell can favorably be used, thereby improving the distribution of the threshold voltage. Furthermore, reprogram operation of the selected memory cells can provide high reliability. FIG. 12 is a flow chart schematically illustrating embodiment of operation procedure performed by the memory controller 110 of FIG. 2. In the all bit line (ABL) structured cell array, all of the memory cells connected to one word line are programmed same time. Thus adjacent memory cells sharing the same word line can cause interference to each other during the program operation. One memory cell can be interfering cell, the other memory cell adjacent to the one memory cell can be victim cell. That is to say, one memory cell having a target state P3 can be interfering cell, while the other memory cell having a target state P2 can be victim cell. In order to compensate the interfering effect, the verify voltage of victim cell can be adjusted based the on the interfering cell data. The control operation of the memory controller 110 for compensating the interfering effect will be described with reference to FIG. 12.

The memory controller 110 acquires the program data for selected memory cells. The selected memory cells are connected to a same word line. One of the selected memory cell can be interfering cell, while the other cell adjacent to the one cell among the selected memory cell can be victim cell in accordance with the program data (S310).

Based on the program data, the memory controller 110 determines an amount of shift in the threshold voltage of the currently-programmed memory cells. In addition, the memory controller 110 determines verify voltages for each memory cells depending on the magnitude of shift in the determined threshold voltage (S320).

The memory controller 110 controls the non-volatile memory device 120 to program the programmed data to the selected memory cells using the determined level of the verify voltage. That is, the memory controller 110 provides a command for the non-volatile memory device 120 to trim its voltage to the determined verify voltage based on the program data before the program operation may be executed. After the verify voltages of each of the selected memory cells are trimmed, the memory controller 110 provides a program data and a program command for the non-volatile memory device 120 to program the program data to the selected memory cells (S330).

After the MSB page data is programmed to the selected memory cells, the threshold voltage distribution of the selected memory cells may increase. However, further programming operation is needed to increase the read margin. Thus, further programming operation under the condition of original program verify voltage can be executed. Thus, the program operation for the selected memory cell may be completed after the program operation for the selected memory cells via original program verify voltage is completed (S340).

According to the above-mentioned programming method, the physical influence, for example, coupling occurred by an interfering cell may be changed into favorable influence for completing the programming of the selected memory cell. As a result, errors due to the coupling between memory cells may be prevented or reduced during the programming of one page data.

Figure 13:
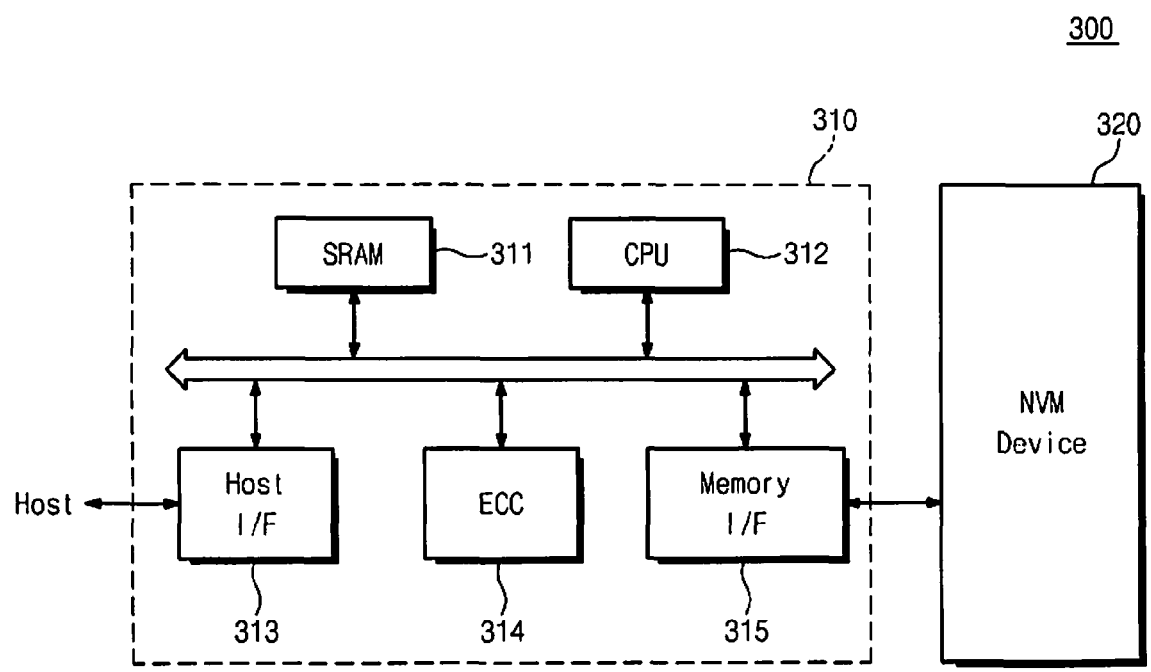
FIG. 13 is a block diagram illustrating a memory system according to example embodiments of the inventive concepts.

FIG. 13 is a block diagram schematically illustrating a memory system 300 according to example embodiments of the inventive concepts. Referring FIG. 13, the memory system 300 includes a non-volatile memory device 320 and a memory controller 310.

The non-volatile memory device 320 may be configured as a flash memory device having the cell array 10 illustrated in FIG. 1. The memory controller 310 may be adapted to control the non-volatile memory device 320. The non-volatile memory device 320 and memory controller 310 may be integrally combined to form a memory card or a solid state disk (SSD). An SRAM 311 may be used as an operation memory of a processing unit 312. A host interface 313 includes a data exchange protocol of a host connected to the memory system 300. An error correction code (314) detects and corrects errors included in the data read out from the non-volatile memory device 320. A memory interface 315 interfaces with the non-volatile memory device 320. The processing unit 312 performs various control operations for exchanging data with the memory controller 310.

Although not illustrated, it may be apparent to those skilled in the art that the memory system 300 may further include a ROM (not shown) to store code data for interfacing with the host. The non-volatile memory device 320 may be provided as a multi-chip package having a plurality of flash memory chips. The memory system 300 may be provided as a storage medium having lower error probability and higher reliability. In particular, the flash memory device according to example embodiments of the inventive concepts may be provided to a memory system, for example, a solid state disk (SSD), which may be vigorously studied. In example embodiments of the inventive concepts, the memory controller 310 may be adapted to communicate with external apparatus (for example, a host) using any one of various interface protocols, for example, USB, MMC, PCI-E, SATA, PATA, SCSI, ESDI, and IDE.

The memory controller 310 controls the non-volatile memory device 320 in manners described in example embodiments of the inventive concepts. That is, during the program operation, the memory controller 310 acquires data for the interfering cells and selects the verify voltages corresponding to the selected memory cells. The memory controller 310 may selectively be provided with, for example, a manufacturer and a product serial number, process parameters, disturbance, retention, a programming/erasing cycle (P/E cycle), and characteristics acquired from a pilot cell to estimate more accurately characteristics of coupling or interference.

Figure 14:
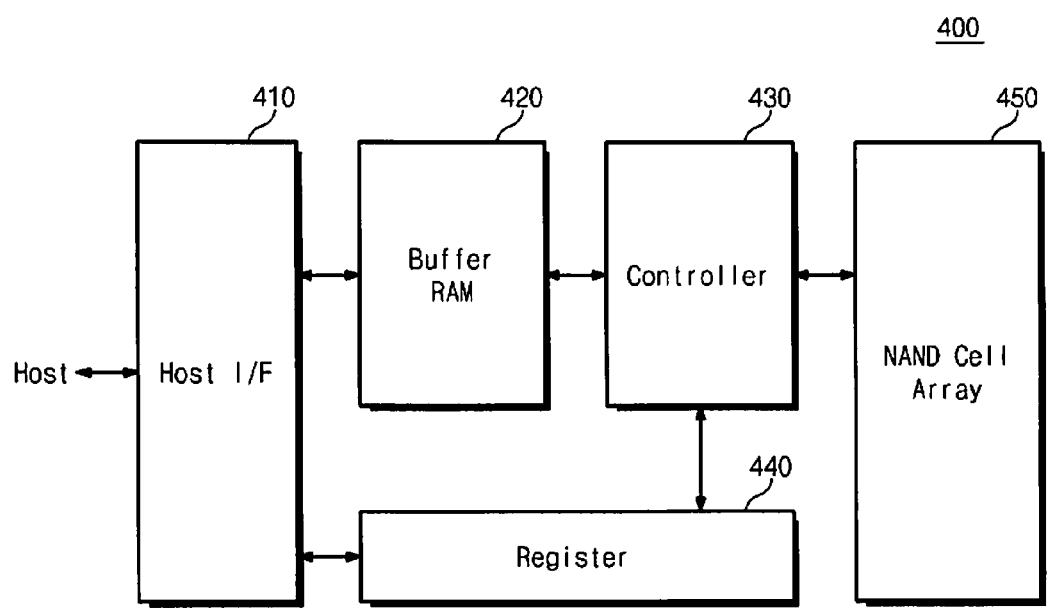
FIG. 14 is a block diagram illustrating a fusion memory device according to example embodiments of the inventive concepts.

FIG. 14 is a block diagram schematically illustrating a fusion memory device or a fusion memory system 400 that performs the program operation according to the above-described example embodiments of the inventive concepts. For example, the technical features of example embodiments of the inventive concepts may be applied to the OneNAND flash memory device 400 as a fusion memory device.

The OneNAND flash memory device 400 includes a host interface 410 for exchanging various kinds of information with apparatuses which use different protocols, a buffer RAM 420 for containing a code for driving a memory device or temporarily storing data, a control unit 430 for controlling a readout operation, a program operation and all states in response to externally-provided control signals and commands, a register 440 for storing data, for example, a command, an address, and configurations defining the internal system operation environment of the memory device, and a NAND flash cell array 450 having a non-volatile memory cell and a page buffer. In response to a writing request from the host, the OneNAND flash memory device 400 may write data in the NAND flash cell array 450 depending on the program procedure according to example embodiments of the inventive concepts to prevent or reduce the physical influences of interfering cells.

Figure 15:
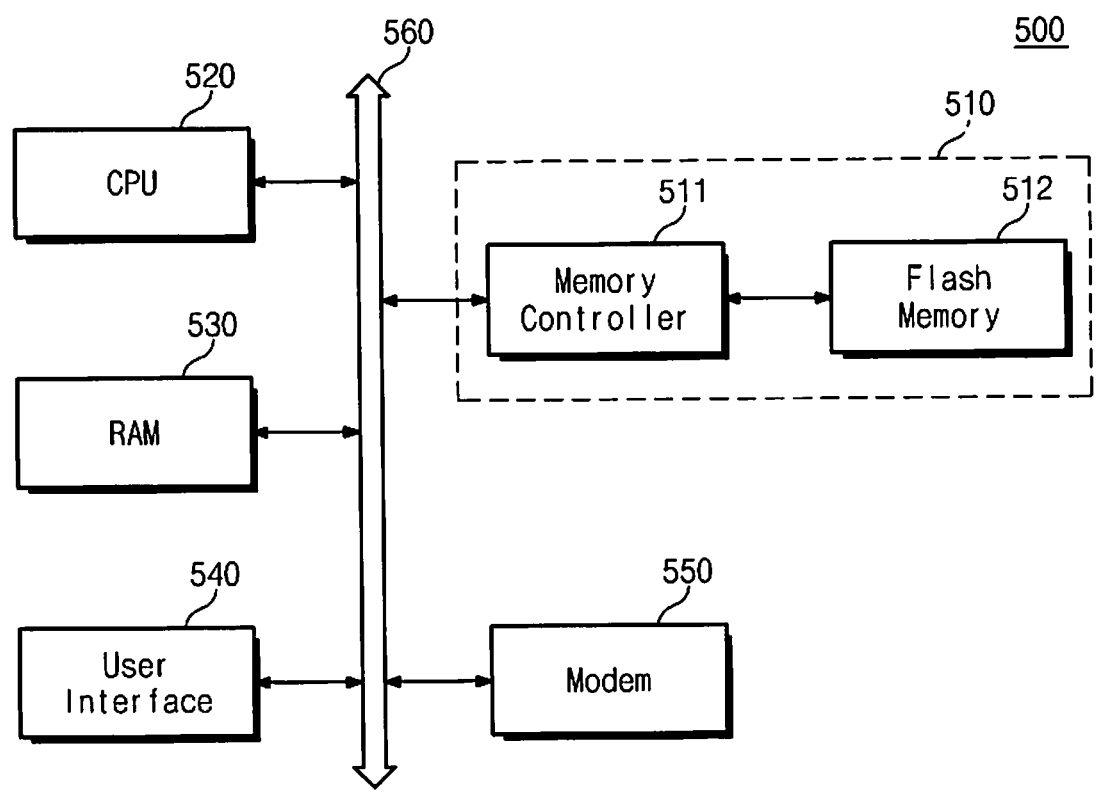
FIG. 15 is a block diagram illustrating the configuration of a computing system according to example embodiments of the inventive concepts.

FIG. 15 schematically illustrates a computing system 500 including a flash memory device 512 according to example embodiments of the inventive concepts. The computing system 500 includes a microprocessor 520, a RAM 530, a user interface 540, a modem 550, for example, a baseband chipset, and a memory system 510, which may be electrically connected to a system bus 560, respectively. The memory system 510 may be substantially configured in the same manner as illustrated in FIG. 8 or 9. When the computing system 500 is a mobile device, a battery (not illustrated) may be further provided to supply the operation voltage of the computing system 500. Although not illustrated, it may be apparent to those skilled in the art that the computing system 500 may be further provided with, for example, an application chipset, a camera image processor (CIP), or a mobile DRAM.

The memory system 510 may form a Solid State Drive/Disk (SSD) using the non-volatile memory to store data. Alternatively, the memory system 510 may form the fusion flash memory (for example, OneNAND flash memory). The computing system 500 may receive data having higher reliability from the memory system 510, using the characteristic analysis of distributions by the acquisition of index data and the separation of distribution depending on a degree of influence by the shift of the threshold voltage, for example, coupling. With respect to the characteristic analysis of distributions by index data and the separation of distribution depending on a degree of influence by the shift of the threshold voltage, for example, coupling, these may be carried out in the memory system 510 or may be executed by the control of the microprocessor 520 of the computing system 500. Alternatively, for the effective utilization of resources, the memory system 510 and the microprocessor 520 share the characteristic analysis of distributions and the separation of distribution depending on a degree of influence by the shift of the threshold voltage with each other.

The flash memory device and/or the memory controller according to example embodiments of the inventive concepts may be mounted using various types of packages. For example, the flash memory device and/or the memory controller according to example embodiments of the inventive concepts may be mounted packages, for example, a PoP (Package on Package), a Ball grid array (BGA), a Chip scale package (CSP), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flat Pack (TQFP), a Small Outline (SOIC), a Shrink Small Outline Package (SSOP), a Thin Small Outline (TSOP), a System In Package (SIP), a Multi Chip Package (MCP), a Wafer-level Fabricated Package (WFP), and a Wafer-level Processed Stack Package (WSP).

According to example embodiments of the inventive concepts, when page data is programmed in a non-volatile memory, the interference between memory cells can be changed to improve the program and provide the non-volatile memory device having higher reliability.

Example embodiments have been illustrated and disclosed in the drawings and the specification. The specific terms used herein are intended to illustrate the inventive concepts only and not to limit their meanings or the scope of the inventive concepts. Those skilled in the art will recognize that various variations, changes, modifications, and equivalents can be made without departing from the spirit and scope of the inventive concepts. Accordingly, the true technical scope of the inventive concepts shall be defined by the technical spirit of the attached claims.

What is claimed is:

1. A programming method of a non-volatile memory device, comprising:
   adjusting a program-verify-voltage of a selected memory cell referring to program data to be written in an interfering cell configured to provide interference for the selected memory cell;
   programming the selected memory cell using the adjusted program-verify-voltage; and
   programming the selected memory cell using an original program-verify-voltage.

2. The programming method of claim 1, wherein the interfering cell is connected to the same word line as the selected memory cell, and the interfering cell is selected by different page addresses.

3. The programming method of claim 1, wherein the interfering cell is connected to any word line other than a word line connected to the selected memory cell but connected to the same bit line as the selected memory cell.

4. The programming method of claim 1, wherein the interfering cell is connected to any bit line and word line other than a bit line and a word line connected to the selected memory cell but connected to bit lines adjacent to the bit line connected to the selected memory cell.

5. The programming method of claim 1, wherein the program-verify-voltage is classified into a plurality of levels depending on the amount of interference, and the amount of interference is quantified based on the programming data to be written in the interfering cell.

6. The programming method of claim 1, further comprising:
   programming the interfering cell after the selected memory cell is programmed.

7. The programming method of claim 1, wherein the adjusted program-verify-voltage for the selected memory cell is equal to or below a threshold voltage corresponding to the original program-verify-voltage of the selected memory cell.

8. The programming method of claim 1, wherein the interfering cell is a memory cell where a threshold voltage is changed from an erased state to a program state during a program operation.

9. The programming method of claim 1, further comprising:
   performing a program-verify operation using the adjusted program-verify-voltage when an MSB (Most Significant Bit) page is programmed to the selected memory cell.

10. The programming method of claim 9, wherein the program data to be written in the interfering cell are the MSB (Most Significant Bit) page data out of a plurality of page data to be written in the interfering cell.

11. The programming method claim 1, wherein when the selected memory cell is a memory cell where the last page data out of a plurality of successively programmed page data is written, the memory cell to be selected at a subsequent program operation of the selected memory cell is designated as a dummy page where data is not written.

12. The programming method claim 1, wherein when the original program-verify-voltage is predetermined reference program-verify-voltage of a target state.

13. A memory system comprising:
   a non-volatile memory device; and
   a memory controller controlling the non-volatile memory device to adjust a program-verify-voltage of a selected memory cell referring to program data to be written in an interfering cell, the interfering cell configured to provide interference for the selected memory cell of the non-volatile memory device and to program the selected memory cell depending on the adjusted program-verify-voltage,
   wherein the memory controller is configured to reprogram the selected memory cell using an original program-verify-voltage corresponding to a target state of the selected memory cell after programming the interfering cell.

14. The memory system of claim 13, wherein the memory controller controls the non-volatile memory device to generate the adjusted program-verify-voltage.

15. The memory system of claim 13, wherein the non-volatile memory device is configured as a flash memory device including a cell array.

16. The memory system of claim 13, wherein the non-volatile memory device and memory controller are integrally combined to form a memory card or a solid stated disk (SSD).

17. The memory system of claim 13, wherein the memory controller further comprises:
   a static random access memory (SRAM), a processing unit, a host interface, an error correction code and a memory interface interconnected by a bus.

18. The memory system of claim 17, wherein the SRAM functions as an operation memory of the processing unit and the processing unit performs control operations for exchanging data with the memory controller.

19. The memory system of claim 17, wherein the error correction code detects and corrects errors included in data read out from the non-volatile memory device.

20. The memory system of claim 17, wherein the host interface includes a data exchange protocol of a host connected to the memory system and a memory interface interfaces with the non-volatile memory device.

\* \* \* \* \*